United States Patent [19]

Schuster et al.

[11] 4,225,695

[45] Sep. 30, 1980

[54] RADIATION-HARDENABLE BINDERS BASED ON THIO-POLYOLS

[75] Inventors: Karl-Ernst Schuster, Kerken; Hans J. Rosenkranz, Krefeld; Hans Rudolph, Krefeld; Karl Fuhr, Krefeld; Bruno Zorn, Cologne; Harro Träubel, Leverkusen, all of Fed. Rep. of Germany

[73] Assignee: Bayer Aktiengesellschaft, Fed. Rep. of Germany

[21] Appl. No.: 934,047

[22] Filed: Aug. 15, 1978

[30] Foreign Application Priority Data

Aug. 19, 1977 [DE] Fed. Rep. of Germany ....... 2737406

[51] Int. Cl.² ...................... C08G 18/52; C08G 18/62
[52] U.S. Cl. ................... 528/75; 204/159.19; 428/262; 428/473; 528/76; 528/83; 430/285; 430/322
[58] Field of Search ............................. 528/75, 76, 83

[56] References Cited

U.S. PATENT DOCUMENTS

| T951,007 | 10/1976 | Koncos | 528/75 |
|---|---|---|---|
| 3,297,745 | 1/1967 | Fekete et al. | 526/301 |
| 3,396,210 | 8/1968 | McKillip et al. | 528/75 |
| 3,509,234 | 4/1970 | Burlant et al. | 528/75 |
| 3,600,359 | 8/1971 | Miranda | 528/75 |
| 3,700,643 | 10/1972 | Smith et al. | 528/75 |

FOREIGN PATENT DOCUMENTS 743514 1/1956 United Kingdom .

OTHER PUBLICATIONS

DAS 1,644,797, Burlant (Ford Motor Co.), Jan. 16, 1975.

Primary Examiner—H. S. Cockeram
Attorney, Agent, or Firm—Connolly and Hutz

[57] ABSTRACT

A radiation-hardenable binder consisting of a reaction product of:
(A) 1 gramme equivalent of NCO of a polyisocyanate containing 2 to 3 isocyanate groups per molecule,
(B) 0 to 0.7 gramme equivalents of OH of a polyol containing at least 2 OH-groups per molecule, free from organically combined sulphur,
(C) 0.01 to 0.7 gramme equivalents of OH of a hydroxyalkyl acrylate containing 2 to 6 carbon atoms in the alkyl group characterized in that the reaction product additionally has incorporated therein:
(D) 0.01 to 0.3 gramme equivalents of OH of a polyol containing thio or dithio groups or thio and dithio groups, with at least 2 OH-groups per molecule,
the sum of the OH gramme equivalents B to D is from 1 to 1.2, and the content of organically combined sulphur, derived from the thio and dithio groups, is from 0.01 to 10% by weight, based on the binder.

4 Claims, No Drawings

RADIATION-HARDENABLE BINDERS BASED ON THIO-POLYOLS

This invention relates to radiation-hardenable binders composed of reaction products of polyols containing thio groups and/or dithio groups, optionally sulphur-free polyols and hydroxyalkyl acrylates.

The reaction of isocyanate prepolymers with hydroxyalkyl acrylates is generally known and leads to the so-called urethane acrylates which, mixed with a wide variety of vinyl monomers, represent valuable raw materials for ultra-violet light and electron-beams-hardening lacquers. Such products are described, for example, in German Auslegeschrift No. 1,644,797, in British Pat. No. 743,514 and in U.S. Pat. No. 3,297,745.

A general characteristic of such urethane acrylates is that they are easy to produce and their characteristic form may be affected within wide limits by varying the components used. Experience shows, however, that urethane acrylates, like all lacquer raw materials which cross-link as a result of vinyl polymerisation, are greatly inhibited by atmospheric oxygen during their hardening process. For example, if a urethane acrylate provided with a photo-initiator is exposed to ultra-violet light by means of a photographic half-tone step wedge, then it is easy to determine that the velocity of cross-linking on the surface of the resin varies by a large magnitude depending on whether exposure is effected in the presence of atmospheric oxygen or in an inert gas atmosphere. It may generally be said that only those urethane acrylates containing a large accumulation of cross-linking points can be hardened in the presence of atmospheric oxygen within practical periods. However, the skilled man knows that films produced from such products are extremely hard and brittle, even in thin layers, so that they cannot be considered for lacquering flexible materials such as, for example, plastics films, paper or textiles.

However, if the density of cross-linking of such urethane acrylates is reduced so as to produce elastic films, then the point is very soon reached at which the reactivity of the system is insufficient to overcome the air-inhibition of the surface of the film during ultra-violet light hardening. These coatings are no longer free from tackiness even after a prolonged period of exposure. There have, of course, been many attempts to eliminate this decisive short-coming. Thus, urethane acrylates which are modified by unsaturated fatty acids are described, for example, in German Auslegeschrift No. 2,157,115, in German Auslegeschrift No. 2,158,529 and in German Offenlegungsschrift No. 2,601,408. As such raw materials, as is generally known, can undergo cross-linking reactions under the action of atmospheric oxygen, such a process should compensate the oxygen inhibition of acrylic ester polymerisation. However, it has been found in practice that the desired effect is never obtained at the necessary velocity. Such binders also initially exhibit a tacky surface directly after hardening.

Another means of obtaining urethane acrylates with lower inhibition by atmospheric oxygen involves incorporating synergistic substances such as, for example, tertiary amines into the resin. Such products also exhibit significantly increased reactivity with a lower density of cross-linking. Urethane acrylates of this type are described, for example, in German Offenlugungsschrift No. 2,140,306. However, it is not possible in this way to produce binders which are highly elastic and which have, for example, an elongation at break of more than 100%. Amine-modified urethane acrylates with a practical rate of curing have proved to be too hard and brittle for coating plastics materials.

It was therefore very surprising and unexpected that the incorporation of sulphur in the form of thio groups and/or dithio groups in urethane acrylates leads to binders which are not only more reactive but are also much more elastic than comparable sulphur-free binders, particularly after radiation hardening. It does not matter how the sulphur is incorporated in the resin, whether in the form of thio groups (—S—) or dithio groups (—S—S—), but it is only very effective with respect to the elasticity in these forms, i.e. in the formal oxidation levels of $-1$ or $-2$. If thioethers in pure form are added to these binders, the reactivity is increased but the elasticity is not affected.

The invention accordingly provides radiation-hardenable binders comprising reaction products of polyisocyanates with polyols and hydroxyalkyl acrylates, characterised in that organically-bound sulphur is incorporated into the binder in the form of thio groups and/or dithio groups in an amount of from 0.01 to 10% by weight, based on the binder, and preferably from 0.1 to 5% by weight.

Radiation-hardenable binders comprising the reaction product of the following are preferred:

(A) 1 gramme-equivalent of NCO of a polyisocyanate containing 2 to 3, in particular 2 isocyanate groups per molecule, (B) 0 to 0.7 gramme-equivalents of OH of a polyol containing at least 2, in particular 2 to 6 OH-groups per molecule, free from organically-bound sulfur, (C) 0.01 to 0.7 gramme-equivalents of OH of a hydroxyalkyl acrylate containing 2 to 6, in particular 2 to 4 carbon atoms in the alkyl group, characterised in that the reaction product also has incorporated therein:

(D) 0.01 to 0.3 gramme equivalents of OH of a polyol containing a thio or dithio group or thio and dithio groups, with at least 2, in particular 2 to 4 OH groups per molecule, the sum of the OH-gramme-equivalents B to D is 1 to 1.2 and the organically-bound sulphur content, originating from the thio and dithio groups, is from 0.01 to 10% by weight, in particular 0.1 to 5% by weight, based on the binder.

The application also relates to mixtures of sulphur-modified urethane acrylates with monofunctional and/or polyfunctional vinyl monomers as radiation-hardenable binders.

The term "polyisocyanates" is understood to mean di-functional and higher functional isocyanates, preferably di-functional and trifunctional, in particular difunctional isocyanates. Examples include: toluylene diisocyanate, diphenylmethane diisocyanate, isophorone diisocyanate, xylylene diisocyanate and hexamethylene diisocyanate.

The polyisocyanates may be reacted with difunctional and higher functional polyols or diamines and polyamines containing at least two primary amino groups to form isocyanate prepolymers, wherein the polyol component may also be a polyether polyol and/or polyester polyol (cf. British Pat. No. 743,514 and U.S. Pat. No. 2,969,386).

A "gramme-equivalent of NCO" is understood to mean the amount of a compound in grammes in which one isocyanate group is contained. Correspondingly, a "gramme-equivalent of OH" is the amount of a compound in grammes in which one hydroxyl group is contained.

Component B preferably consists of aliphatic, saturated, 2- to 6-hydric, in particular 2- to 4-hydric polyols with OH numbers of 50 to 1830, preferably 100 to 1060 [mg of KOH/g of substance], or the above-mentioned polyols whose aliphatic chains contain one or more identical or different groups of the phenylene, cyclohexylene, oxy (—O—), carboxylato

ureylene

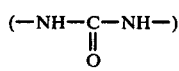

and oxycarbonylamino

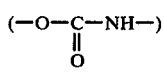

series or mixtures of the polyols. The component B is free from organically-bound sulphur.

Hydroxyethylated aliphatic saturated diols and/or triols with OH numbers of from 100 to 1060 (mg of KOH per gramme of substance) are particularly preferred as component B.

Examples of component B include:

1. Aliphatic saturated 2- or 6-hydric alcohols, in particular 2- to 4-hydric alcohols such as, for example, ethylene glycol, propane diol-1,2, propane diol-1,3, neopentyl glycol, butane diol-1,4, hexanediol-1,6, decane diol-1,10, glycerine, trimethylol propane, pentaerythritol, dipentaerythritol, as well as the oxalkylation products of the 2- to 6-hydric alcohols with 1,2-alkylene oxides such as ethylene oxide or propylene oxide; cycloaliphatic diols such as cyclohexane diol-1,4 and 4,4'-dihydroxy-cyclohexyl-2,2- alkanes such as 4,4'-dihydroxycyclohexyl-2,2-propane and araliphatic dihydric alcohols, optionally containing 1 to 2 ether oxygen atoms such as bis(hydroxyethylated)bisphenol A and bis(hydroxy propylated)bisphenol A.

2. Saturated or unsaturated, preferably saturated polyesters containing at least two free hydroxyl groups formed from the alcohols listed under 1 and at least one polycarboxylic acid or its anhydrides, in particular dicarboxylic acids such as maleic acid, fumaric acid, mesaconic acid, citraconic acid, itaconic acid, succinic acid, glutaric acid, adipic acid, sebacic acid, phthalic acid, isophthalic acid, teraphthalic acid, trimellitic acid, hexahydophthalic acid, tetrahydrophthalic acid, endomethylene tetrahydrophthalic acid and methylhexahydrophthalic acids.

3. Mixtures of 1 and 2.

4. Polyols containing ureylene and/or oxycarbonyl amino (=urethane) groups, obtained from the polyols listed under 1 and 2 and the polyisocyanates mentioned in detail under (A) and in the application.

Suitable hydroxyalkyl acrylates (C) include, for example, 2-hydroxyethyl-, 2-hydroxypropyl-, 2-hydroxybutyl-3-hydroxypropyl-, 4-hydroxybutyl- and 6-hydroxyhexylacrylate, 2-Hydroxyethyl acrylate, 2-hydroxypropyl acrylate and 4-hydroxybutyl acrylate are preferred.

Component (D) preferably includes aliphatic saturated 2- to 4-hydric, in particular dihydric polyols with OH numbers of from 50 to 920 and with at least one thio group and/or at least one dithio group, preferably at least one thio group in the aliphatic chain, which may contain in addition one or more identical or different groups of the phenylene, cyclohexylene, oxy, carboxylato, ureylene and oxycarbonylamino series, or mixtures of the polyols.

Particularly preferred examples of component (D) are saturated aliphatic glycols containing one or more thio groups in the aliphatic chain, saturated aliphatic glycols containing one or more thio groups and one or more oxy groups and one or more carboxylato groups in the aliphatic chain, saturated aliphatic glycols containing one or more thio groups and one or more oxy groups (—O—) in the aliphatic chains, as well as glycols, obtained by reaction of 1 mol of a diglycidyl ether of a glycol or diphenol or of a diglycidyl ester of a dicarboxylic acid containing 2 mol of a mercaptan, all the particularly preferred glycols having OH numbers of about 200 to 920.

Examples of component (D) containing at least two aliphatic hydroxyl groups and at least one thio or dithio group and which have OH numbers of from 50 to 920 in each case, include, in particular:

1. Hydroxyalkylation products containing two aliphatic hydroxyl groups obtained from hydrogen sulphide or thiodiglycols and 1,2-alkylene oxides or 1,2-cycloalkylene oxides such as ethylene oxide, 1,2-propylene oxide, 1,2-butylene oxide, cyclohexylene oxide or mixtures thereof, and styrene oxide, in particular ethylene oxide.

When ethylene oxide, for example, is used, these hydroxyalkylation products correspond to the general formula:

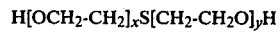

wherein
x or y denote integers greater than 0, resulting in OH numbers of from 50 to 920.

2. Condensation products from hydroxyalkylation products obtained according to (D1), for example thiodiglycol, alone or in admixture and optionally in the presence of sulphur-free dihydric and polyhydric alcohols. The condensation products should have OH numbers of from 50 to <920.

3. Hydroxyalkylation products of alkylene oxides as indicated under (D1) and dimercapto alkanes such as dimercaptoethane, dimercaptobutane or dimercaptodialkyl sulphides such as dimercaptodiethyl sulphide.

4. Dihydroxydialkyl sulphides containing more than 2 carbon atoms in the alkyl group such as 4,4'-dihydroxydibutyl sulphide and its hydroxyalkylation products with alkylene oxides, as indicated under (D1).

5. Hydroxyalkylation products of alkylene oxides as indicated under (D1) and trihydric and higher hydric mercapto alkanols (the functionality depends on the sum of HS- and HO-groups) such as thioglycerine and dithioglycerine.

6. Hydroxyalkylation products of alkylene oxides, as indicated under (D1), and thiodiglycolic acid, dithiodiglycolic acid; alkylene-bis(thioglycolic acids) such as methylene-bis (thioglycolic acid), ethylene-bis (thioglycolic acid), tetramethylene-bis (thioglycolic acids);

or dialkyldisulphide-dicarboxylic acids such as diethyl disulphide-2,2'-dicarboxylic acid.

7. Hydroxyalkylation products of alkylene oxides, as indicated under (D1), and mercapto monocarboxylic acids such as thioglycolic acid, thiolactic acid, mercapto butyric acids or mercaptododecanic acid, wherein the carboxyl group and the mercapto group (—SH) are hydroxyalkylated.

8. Condensation products (polyesters from those specified under (D6), dicarboxylic acids containing thio groups and/or dithio groups and aliphatic saturated 2- to 6-hydric, preferably dihydric alcohols as described under (B1) and/or at least one of the diols and polyols containing thio groups or dithio groups specified under (D1) to (D5).

9. Addition products of difunctional and higher functional 1,2-epoxide compounds, for example diglycidyl ethers of bisphenol A or hexahydrophthalic acid diglycidyl esters and hydrogen sulphide according to the equation:

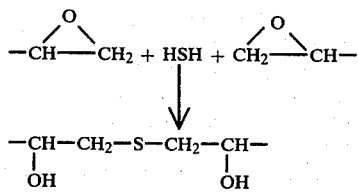

or with mercapto alkanols according to the equation:

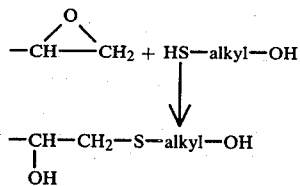

or with dicarboxylic acids containing thio groups and/or dithio groups, as indicated under (D6), according to the equation:

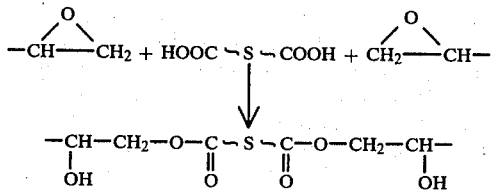

or with dimercaptoalkanes or dimercaptodialkyl sulphides.

The sulphur-containing polyols may be reacted in admixture with conventional polyols, polyether polyols or polyester polyols at temperatures of from 20° to 150° C. with polyisocyanates to form sulphur-containing polyisocyanate prepolymers.

These sulphur-containing isocyanate prepolymers may be reacted in a subsequent reaction with hydroxyalkyl acrylates at temperatures of from 20° to 90° C., and the reactions may be carried out equally well in the single pot process or in several stages.

The reaction between the polyisocyanates and the polyols may be catalysed in a manner known per se, for example using tin octoate, dibutyl tin dilaurate or tertiary amines. The urethane acrylate may also be protected from premature and undesirable polymerisation by the addition of suitable inhibitors and anti-oxidants, each in an amount of from 0.001 to 0.1% by weight, based on the total mixture. These polymerisation inhibitors are also advantageously used for obtaining high stability during storage in the dark.

Suitable auxiliaries of this type include, for example, phenols and phenol derivatives, preferably sterically hindered phenols containing alkyl substituents having 1 to 6 carbon atoms in both o-positions relative to the phenolic hydroxy group, amines, preferably secondary acrylamines and their derivatives, quinones, copper-I-salts of organic acids or addition compounds of copper (I) halides with phosphites.

The following are mentioned in particular: 4,4'-bis-(2,6-di-tert.-butyl-phenol), 1,3,5-trimethyl-2,4,6-tris-(3,5-di-tert.-butyl-4-hydroxy-benzyl)-benzene, 4,4'-butylidene-bis-(6-tert.-butyl-m-cresol), 3,5-di-tert.-butyl 4-hydroxybenzyl-phosphonic acid ethyl ester, N,N'-bis-($\beta$-naphthyl)-p-phenylene-diamine N,N'-bis-(1-methylheptyl)-p-phenylene diamine, phenyl-$\beta$-naphthylamine, 4,4'-bis-($\alpha,\alpha$-dimethylbenxyl)-diphenyl-amine, 1,3,5-tris-(3,5-di-tert.-butyl-4-hydroxyhydrocinnamoyl)-hexahydro-s-triazine, hydroquinone, p-benzoquinone, 2,5-di-tert.-butylquinone, toluhydroquinone, p-tert.-butyl-benzcatechol, 3-methylbenzcatechol, 4-ethylbenzcatechol, chloranil, naphthoquinone, copper naphthenate, copper octoate, Cu(I)Cl/triphenyl phosphite, Cu(I)Cl/trimethyl phosphite, Cu(I)Cl/trischloroethyl phosphite, Cu(I)Cl/tripropyl phosphite and p-nitrosodimethylaniline.

Other suitable stabilizers are described in "Methoden der organischen Chemie" (Houben-Weyl), 4th edition, Volume XIV/1, pages 433–452, 756, Georg Thieme Verlag, Stuttgart, 1961. An eminently suitable stabilizer is, for example, p-benzoquinone and/or hydroquinone momomethyl ether in a concentration of from 0.001 to 0.05% by weight, based on the total mixture.

The reaction products according to the invention may be used in part without the addition of copolymerisable monomers or solvents. However, since these are viscous products in many cases, it is advisable to mix them with copolymerisable monomers so as to obtain processible viscosities and/or to vary the properties of the hardening products.

Suitable monomers include:

(1) Esters of acrylic or methacrylic acid with aliphatic $C_1$-$C_8$, cycloaliphatic $C_5$-$C_6$, or araliphatic $C_7$-$C_8$ monoalcohols, for example methyl acrylate, ethyl acrylate, n-propyl acrylate, n-butyl acrylate, methylhexyl acrylate, 2-ethylhexyl acrylate and the corresponding methacrylic acid esters; cyclopentyl acrylate, cyclohexyl acrylate or the corresponding methacrylic acid esters; benzyl acrylate, $\beta$-phenylethyl acrylate and corresponding methacrylic acid esters;

(2) Hydroxyalkyl esters of acrylic or methacrylic acid with 2 to 4 carbon atoms in the alcohol component, such as 2-hydroxyethyl acrylate, 2-hydroxypropyl acrylate, 2-hydroxypropyl acrylate, 2-hydroxybutyl acrylate, 4-hydroxybutyl acrylate or corresponding methacrylic acid esters;

(3) Diacrylates and polyacrylates as well as dimethacrylates and polymethacrylates of glycols with 2 to 6 carbon atoms and polyols with 3 to 4 hydroxyl groups and 3 to 6 carbon atoms, such as ethylene glycol diacrylate, propane diol-1, 3-diacrylate, butane diol-1,4-diacrylate, hexane diol-1,6-diacrylate, trimethylol-propane triacrylate, pentaerythritol triacrylate and tetraacrylate, as well as corresponding methacrylates, and also di(meth)acrylates of polyether glycols of glycol, propane diol-1,3 and butane diol-1,4;

(4) Aromatic vinyl and divinyl compounds such as styrene, methyl styrene and divinyl benzene;

(5) N-methylol acrylamide or N-methylol methacrylamide as well as corresponding N-methylol alkyl ethers with 1 to 4 carbon atoms in the alkyl ether group and corresponding N-methylol allyl ethers, in particular N-methoxymethyl (meth)-acrylamide, N-butoxymethyl (meth)acrylamide and N-allyloxymethyl (meth)-acrylamide;

(6) Vinyl alkyl ethers with 1 to 4 carbon atoms in the alkyl group, such as vinyl methyl ether, vinyl ethyl ether, vinyl propyl ether and vinyl butyl ether;

(7) Trimethylolpropane diallyl ether mono(meth)acrylate, vinyl pyridine, N-vinyl carbazole, triallyl phosphate, triallyl isocyanurate and others.

Mixtures of one or more the the preceding monomers may also be used. The amounts added are about 5 to 50% by weight, preferably 20 to 40% by weight, based on the mixture of reaction products according to the invention and additional monomers.

It is also possible to obtain a suitable viscosity by mixing with inert solvents such as butyl acetate, ethyl acetate, ethanol, isopropanol, butanol, acetone, ethyl methyl ketone, diethyl ketone, cyclohexane, cyclohexanone, cyclopentane, cyclopentanone, n-heptane, n-hexane, n-octane, iso-octane, toluene, xylene, methylene chloride, chloroform, 1,1-dichloroethane, 1,2-dichloroethane, 1,1,2-trichloroethane and carbon tetrachloride. From 5 to 50% by weight, preferably 20 to 40% by weight, of solvents, based on the mixture of the reaction product according to the invention and solvent, may be added in order to obtain such a processible viscosity.

Of course, it is also possible to use mixtures of additional monomers and solvents within the specified proportions.

Hardening of the reaction products according to the invention, optionally mixed with other copolymerisable monomers, may be affected by means of high-energy radiation, such as ultra-violet light, electron beams or gamma rays, or in the presence of substances releasing radicals such as thermal polymerisation initiators.

The reaction products according to the invention are preferably used as coating compositions which may be hardened by ultra-violet light, and when so used they have the particular advantage of curing in very short periods of time in the presence of atmospheric oxygen. The addition of photo-initiators in necessary for this application.

Suitable photo-initiators include the conventionally used compounds, for example benzophenone as well as quite generally aromatic keto compounds which are derived from benzophenone, such as alkyl benzophenones, halogen-methylated benzophenones, according to German Offenlegungsschrift No. 1,949,010, Michlers ketone, anthrone and halogenated benophenones. Benzoin and its derivatives are also suitable, for example in accordance with German Offenlegungsschriften Nos. 1,769,168; 1,769,853; 1,769,854; 1,807,297; 1,807,301; 1,916,678; 2,430,081 and German Auslegeschrift No. 1,694,149. Other effective photo-initators are anthraquinone and many of its derivatives, for example β-methylanthraquinone, tert.-butyl anthraquinone and anthraquinone carboxylic acid ester, and also oxime esters according to German Offenlegungsschrift No. 1,795,089.

If the reaction products according to the invention are hardened without the addition of other monomers, then the oxime esters from German Offenlegungsschrift No. 1,795,089 as well as benzophenone derivatives from German Offenlegungsschrift No. 1,949,010 are preferably used as photoinitiators.

The above-mentioned photo-initators, which may be used in quantities of between 0.1 and 20% by weight, preferably from 0.1 to 5% by weight, based on polymerisable components, depending upon the application, may be used as individual substances or, owing to frequent advantageous synergistic effects, also in combination with each other.

It may often be advantageous to use other additives, whether to improve the film-forming properties of the resin compositions or to obtain a particularly scratch-resistant surface to the coatings. Thus, mixing with other types of resin, for example with saturated or unsaturated polyesters, is quite possible.

The above-mentioned other types of resins are preferably used in quantities of from 1 to 50% by weight, based on the polymerisable components. Basically, however, only those resins which do not impair reactivity should be used concurrently and their quantity accordingly restricted. Suitable lacquer resins which are conventional in the lacquer industry are described in the tables of lacquer raw materials compiled by E. Karsten, 5th edition, Curt R. Vincentz Verlag, Hannover 1972, pages 74 to 106, 195 to 258, 267 to 293, 335 to 347 and 357 to 366.

Advantageous additives which may lead to a further increase in the reactivity include certain tertiary amines such as, for example, triethyl amine and triethanol amine.

The substances mentioned are preferably used in quantities of from 0 to 5% by weight, based on the polymerisable components.

A typical resin according to the invention is produced, for example, by the reaction of a diisocyanate (for example toluylene diisocyanate) with thiodiglycol, hydroxyethyl acrylate and, for example, a trifunctional polyether based on ethoxylated trimethylol propane at 60° C., by passing air over the reaction mixture in the presence of 0.01 parts by weight of tin octoate as catalyst and 0.01% by weight of p-benzoquinone as stabilizer. Upon completion of the reaction, the NCO content of the resin should be <0.1% by weight and the sulphur content determined by elementary analysis may lie between 0.7 and 1% by weight. Such a resin may be mixed with monofunctional, difunctional and/or trifunctional acrylic acid esters and, when provided with a photo-initiator, gives an ultri-violet-hardenable coating for leather, synthetic leather or plastics which, after photopolymerisation, meets the demands with regard to buckling fastness snd resistance to abrasion.

Artificial radiation sources whose emission lies in the range of from 2500 to 5000 Å, preferably from 3000 to 4000 Å, may be used as sources of radiation for carrying out photopolymerisation. Mercury-vapour lamps, xenon lamps and tungsten lamps, in particular high pressure mercury radiation sources, are advantageous.

Layers of the reaction products according to the invention between 1 μm and 0.1 mm thick (1 μm = $10^{-3}$ mm) may generally be cured to form a film in less than one second if they are irradiated at a distance of about 8 cm by the light of a high pressure mercury lamp, for example of the HTQ-7 type made by the Philips Company.

If fillers are used in the ultra-violet light hardenable coatings together with the resin compositions according to the invention, then their use is restricted to those which do not suppress the polymerisation process by their absorption behaviour. Talcum, heavy spar, chalk, plaster of Paris, silicas, asbestos dust and gypsum, for example, may be used as translucent fillers.

If hardening is effected by thermal initiators or by high-energy radiation, for example electron radiation or gamma radiation, then as a general principle any fillers, pigments and reinforcing materials of the types usually used in lacquer chemistry may be used.

The coating medium may be applied to suitable substrates by means of methods which are conventional in the lacquer industry, such as spraying, rolling doctoring, printing, immersing, flooding, brushing or painting.

Suitable substrates include paper, cardboard, leather, wood, plastics, textiles, ceramic materials and metals, preferably plastics and leather. Since the coating media cure to form films having excellent mechanical properties in periods of from fractions of a second to a few seconds, it is possible, for example, to adapt a coating process to the processing speeds conventional in the printing industry.

The binders according to the invention are also eminently suitable for the production of photo-relief printing plates and photo-resist materials.

The Phillips HTQ-7 radiator used in a high pressure mercury lamp made by the Phillips Company.

Some typical embodiments are shown in the following Examples to clarify the invention. The parts and percentages indicated in the Examples are by weight unless otherwise stated.

EXAMPLE 1

An acrylate according to the invention containing urethane groups is produced by the reaction of 111 g of isophorone diisocyanate (0.5 mol) with 46.4 g of hydroxyethyl acrylate (0.4 mol), 6.1 g of thiodiglycol (0.05 mol) and 134 g of a hydroxyethylated trimethylol propane having an OH number of 250(molecular weight 675).

After adding the total amount of isocyanate, the thiodiglycol is added drop-wise within two hours with cooling and stirring at 40° to 50° C., the reaction temperature not being allowed to exceed 60° C. After the addition of 0.1 g of tin octoate and 0.15 g of benzoquinone at 50° to 60° C., the hydroxyethyl acrylate is subsequently introduced drop-wise with cooling and with passage of air in such a way that the temperature does not exceed 65° C. After reaching an NC0- content of about 14% (about 4 hours), the hydroxyethylated trimethylol propane is added in portions.

The mixture is stirred at 60° C. with the passage of dry air until the NCO-content amounts to 0.1% by weight. A colourless and odourless medium viscosity resin is formed.

Comparision 1

The method adopted in Example 1 is carried out but with the modification that 5.3 g of diethylene glycol are used instead of 6.1 g of thiodiglycol. A colourless and odourless resin free from chemically combined sulphur and having an NCO content of <0.1% by weight if formed.

Comparison 2

The method adopted in Example 1 is carried out with the modification that 6.5 g of N-methyl diethanolamine are used instead of 6.1 g of thiodiglycol. This resin, which is free from chemically combined sulphur, cannot be distinguished externally from the resins according to Example 1 and Comparison 1.

Application 50 parts of the resins according to Example 1 and the Comparisons 1 and 2 are reacted with 10 parts of ethyl acetate and with 1.5 parts of α-cyanoethyl-benzoine ethyl ether (photo-initiator) and spread onto a glass plate in a 200 μm thick film by means of a doctor blade. After exposure to the air, the films are cured to tack-free coatings on a conveyor belt having an adjustable belt speed beneath a Philips HTQ-7 radiator. The films cured in this way were then carefully peeled from the glass plate and their elongation at break was examined according to DIN 53 455. The results are shown in Table 1.

TABLE 1

|  | Reactivity (belt speed m/min.) | Elongation at break |
|---|---|---|
| Resin according to Example 1 | 25 | 125 |
| Resin according to Comparison 1 | 10 | 80 |
| Resin according to Comparison 2 | 25 | 80 |

The Table shows that the resin according to the invention in Example 1 is clearly more reactive than an unmodified urethane acrylate and is substantially more elastic than a non-sulphur-modified or a nitrogen-modified urethane acrylate.

EXAMPLE 2

A urethane acrylate prepolymer is produced according to Example 1 but with the modification that 22.4 g of a polyester produced from triethylene glycol and methylene bis-thioglycolic acid (OH number: 250) are used instead of 6.1 g of thiodiglycol.

Comparison 3

A resin is produced as in Example 1 but with the modification that 20 g of a polyester produced from adipic acid and triethylene glycol (OH number: 280) are used instead of 6.1 g of thiodiglycol.

Application

The same application is made as in Example 1. The results are shown in Table 2.

TABLE 2

|  | Reactivity (belt speed m/Min.) | Elongation at break % |
|---|---|---|
| Resin according to Example 2 | 30 | 90 |
| Resin according to Comparison 3 | 10 | 40 |

As shown, the incorporation of organically combined sulphur acts positively on the reactivity and elasticity.

EXAMPLE 3

35 g of a bis-epoxide based on hexahydrophthalic acid bis-glycidyl ester (epoxy equivalent weight: 175) are reacted with 40 g of lauryl mercaptan at 100° C.

The reaction is completed after 24 hours and no more free SH can be detected. The reaction product is subsequently reacted with 34.8 g of toluylene diisocyanate and then with 23 g of hydroxyethyl acrylate. A resin having an NCO content of <0.1% by weight is formed.

Comparison 4

35 g of a bis-epoxide based on hexahydrophthalic acid bis-glycidyl ester (epoxy equivalent weight: 175) are reacted with 40 g of undecane carboxylic acid at 90° C. until an acid number of 0 is reached. The reaction product is subsequently reacted with 34.8 g of toluylene diisocyanate and then with 23.0 g of hydroxyethyl acrylate at a temperature of 60° C. A resin having an NCO content of 0.1% by weight is formed. In Comparison 4, an aliphatic saturated $C_{12}$ carboxylic acid was used instead of the $C_{12}$ mercaptan in Example 3 because the corresponding $C_{12}$ alcohol (lauryl alcohol) did not react completely.

Application

The same application is made as in Examples 1 and 2. The results are shown in Table 3.

TABLE 3

| | Reactivity (belt speed m/min.) | Elongation at break % |
|---|---|---|
| Resin according to Example 3 | 5 | 130 |
| Resin according to Comparison 4 | —x) | —x) | x) The film was still very tacky despite an extremely long period of exposure.

In this application, the advantage of sulphur modification is clearly shown.

EXAMPLE 4

417 g of toluylene diisocyanate are reacted with 36 g of thiodiglycol, 220 g of hydroxyethyl acrylate and 670 g of an ethoxylated trimethylol propane (OH number 250) in the presence of 0.15 g of tin octoate for 8 hours at 60° C. until the NCO value is <0.1%. 500 g of this resin are mixed with 175 g of a triacrylate of ethoxylated trimethylol propane having an OH number of 550, 270 g of hydroxyethyl acrylate, 50 g of benzophenone and 45 g of triethanol amine, as well as with 20 g of a commercial alkyd resin composed of benzoic acid, 2-ethyl caproic acid, phthalic acid, a saturated branched synthetic $C_{18}$-carboxylic acid, trimethylol propane and glycerine. A colourless binder having a viscosity of 10 Poise at a temperature of 20° C. is produced.

Application A

A roughened cotton fabric was coated in the conventional manner with a black-dyed solution of a commercial aromatic polyester polyurethane by the reversal process using separating paper. After drying and removing the synthetic leather, it was printed with the binder according to Example 5 on a printing machine by means of a 48 mesh cylinder. Curing was carried out under a Hannovia radiation source (80 watt/cm) at a belt speed of 20 m/Min. A solvent-resistant scratch-proof and abrasion-proof surface having a lacquer-like lustre was obtained. A similar result is obtained if the mixture is applied by means of a 20μ grooved doctor and the process described above is carried out.

Application B

A conventional red-dyed impregnation composed of a soft polyacrylate binder (about 25 Shore A), albumin and a medium-hard butadiene-acrylonitrile binder (about 40 Shore A) was sprayed on to a lightly ground chromed cow-hide leather which has been retanned in the conventional manner with 6% by weight of synthetic and vegetable tanning materials. The impregnated leather was dried, ironed, stamped and the ultraviolet light hardenable mixture specified in Example 5 and diluted 1:1 with ethyl acetate is then uniformly sprayed on. After curing (polymerisation), by means of a Hannovia radiation source, a shiny abrasion-proof and solvent-proof finish was obtained.

EXAMPLE 5

A polythioether having an OH number of 350 is produced by self-condensation of thiodiglycol according to German Pat. Specification No. 1,039,232.

As described in Example 1, 111 g (0.5 mol) of isophorone diisocyanate are reacted with 46.4 g (0.4 mol) of hydroxyethylacrylate, 16 g of the polythioether produced according to German Pat. No. 1,039,232 and having an OH number of 350, as well as 84 g of a hydroxyethylated trimethylol propane having an OH number of 400 (molecular weight 420). A colourless low-viscosity resin is produced.

100 g of the resin produced in Example 6 are mixed with 3 g of benzophenone and 2.5 g of triethanol amine. A 500μ thick film was cast on a specially pretreated polyester film. After covering the wet film with a very thin plastic sheet, the film was exposed for 90 seconds to a fluorescent tube of the TL-Ak type (Philips Company) by means of a half-tone negative. Upon completion of exposure, the unexposed points were rinsed with ethyl acetate and the relief formed was post-exposed for 10 seconds under a HTQ-7 high pressure radiation source. A relief with a sharp picture was formed.

We claim:

1. A radiation-hardenable binder comprising a reaction product of a polyisocyanate, a hydroxyalkyl acrylate and a polyol, the reaction product having organically-bound sulphur incorporated therein in the form of thio or dithio or thio and dithio groups in an amount of from 0.01 to 10% by weight, based on the binder.

2. A binder according to claim 1, which comprises a reaction product of:
   (A) 1 gramme equivalent of NCO of a polyisocyanate containing 2 to 3 isocyanate groups per molecule,
   (b) 0 to 0.7 gramme equivalents of OH of a polyol containing at least 2 OH-groups per molecule, free from organically combined sulphur,
   (c) 0.01 to 0.7 gramme equivalents of OH of a hydroxyalkyl acrylate containing 2 to 6 carbon atoms in the alkyl group, and
   (D) 0.01 to 0.3 gramme equivalents of OH of a polyol containing at least one thio or dithio or thio and dithio groups being from 0.01 to 10% by weight, based on the binder. The sum of the OH gramme equivalents B to D being from 1 to 1.2 and the content of organically combined sulphur derived from the thio or dithio or thio and dithio groups being from 0.01 to 10% by weight, based on the binder.

3. A binder according to claim 1, wherein the content of organically-bound sulphur is from 0.1 to 5% by weight.

4. A binder according to claim 1, wherein the component B is an aliphatic saturated 2- to 6-hydric polyol having an OH number of from 50 to 1830 mg KOH/g of substance, or is the above-mentioned polyol whose aliphatic chain contains one or more identical or different groups of the phenylene, cyclohexylene, oxy (—O—), carboxylato,

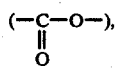

ureylene

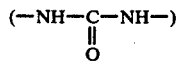

and oxycarbonyl amino

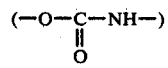

series, or a mixture of such polyols, and component D is an aliphatic saturated 2- to 4-hydric polyol having an OH number of from 50 to 920 mg KOH/g of substance and having one or more thio groups in the aliphatic chain, or the above-mentioned polyol which additionally contains in the aliphatic chain one or more identical or different groups of the phenylene, cyclohexylene, oxy, carboxylato, ureylene and oxycarbonyl amino series.

* * * * *